(12) United States Patent
Kim et al.

(10) Patent No.: US 11,112,840 B2
(45) Date of Patent: Sep. 7, 2021

(54) ELECTRONICS CHASSIS WITH OSCILLATING HEAT PIPE (OHP)

(71) Applicant: Abaco Systems, Inc., Huntsville, AL (US)

(72) Inventors: Joo Han Kim, Huntsville, AL (US); Jonathan Anderson, Huntsville, AL (US); Brian Hoden, Albuquerque, NM (US)

(73) Assignee: Abaco Systems, Inc., Huntsville, AL (US)

( * ) Notice: Subject to any disclaimer, the term of this patent is extended or adjusted under 35 U.S.C. 154(b) by 0 days.

(21) Appl. No.: 16/548,284

(22) Filed: Aug. 22, 2019

(65) Prior Publication Data

US 2021/0055770 A1 Feb. 25, 2021

(51) Int. Cl.
*G06K 1/20* (2006.01)
*H05K 7/20* (2006.01)
*G06F 1/20* (2006.01)
*F28D 15/02* (2006.01)

(52) U.S. Cl.
CPC ............. *G06F 1/20* (2013.01); *H05K 7/2039* (2013.01); *H05K 7/20336* (2013.01); *F28D 15/0275* (2013.01)

(58) Field of Classification Search
CPC .................................................. H05K 7/20436
See application file for complete search history.

(56) References Cited

U.S. PATENT DOCUMENTS

| | | | |
|---|---|---|---|
| 6,388,882 B1 | 5/2002 | Hoover et al. | |
| 7,345,877 B2 * | 3/2008 | Asfia ................... | F28D 15/0266 361/700 |
| 7,460,367 B2 * | 12/2008 | Tracewell .......... | H05K 7/20672 165/104.21 |
| 9,333,599 B2 | 5/2016 | de Bock et al. | |
| 9,750,160 B2 * | 8/2017 | Short, Jr. ........... | H05K 7/20672 |
| 10,012,400 B2 | 7/2018 | Sakami | |
| 2012/0243170 A1 | 9/2012 | Frink et al. | |

(Continued)

FOREIGN PATENT DOCUMENTS

| | | |
|---|---|---|
| EP | 2827691 B1 | 1/2015 |
| EP | 3011249 B1 | 4/2016 |
| EP | 3153808 A1 | 4/2017 |

OTHER PUBLICATIONS

International Search report and Written Opinion issued for Application No. PCT/US2020/047350, dated Nov. 20, 2020.

*Primary Examiner* — Mukundbhai G Patel
(74) *Attorney, Agent, or Firm* — Meunier Carlin & Curfman LLC

(57) ABSTRACT

An electronic chassis for enclosing and cooling electronic equipment is described that includes an oscillating heat pipe (OHP), wherein a first portion of the OHP extends into a rail of the chassis and a second portion of the OHP extends into the side panel on which the rail is located so that at least a portion of heat from operation of electronic equipment on a circuit card assembly (CCA) in contact with the rail passes through the rail to the OHP and from the OHP to a side panel of the chassis on which the rail is located where it is dissipated into an environment. In some instances, the side panel includes cooling fins. Also described is a method for forming such a chassis substantially of metal such as aluminum or its alloys using 3D printing or additive manufacturing.

21 Claims, 12 Drawing Sheets

(56) References Cited

U.S. PATENT DOCUMENTS

| | | |
|---|---|---|
| 2014/0251577 A1 | 9/2014 | Connors |
| 2015/0060023 A1 | 3/2015 | Herring et al. |
| 2015/0101838 A1 | 4/2015 | Shepard et al. |
| 2015/0181763 A1 | 6/2015 | De Bock et al. |
| 2017/0164517 A1* | 6/2017 | Kim ................... F28D 15/046 |
| 2017/0245392 A1 | 8/2017 | Bilski, Jr. et al. |
| 2018/0266773 A1* | 9/2018 | Hislop ................... F28F 1/26 |

* cited by examiner

Section A-A from FIG. 1A

Section A-A from FIG. 1A

ELECTRONICS CHASSIS WITH OSCILLATING HEAT PIPE (OHP)

TECHNICAL FIELD

The subject matter described herein relates generally to an electronics system and, more particularly, to a chassis for an electronics system.

BACKGROUND

Many modern electronics systems function using at least one circuit card assembly (CCA). Most known CCAs include a printed circuit board (PCB) on which at least one chip (or other electronic component) is mounted. Generally, several CCAs are typically mounted within a chassis that facilitates supporting the CCAs and protecting them from external influences such as mechanical shock and vibration, extreme temperature, moisture, debris, and electromagnetic interference (EMI).

Moreover, the various chips of each CCA generates heat during operation of the electronics system, and it is desirable to remove the heat from these chips with minimum temperature rise over ambient in order to keep them functioning optimally and reliably. In that regard, the chassis is commonly placed in conductive heat transfer with at least a portion of each of the CCAs mounted therein to facilitate conductively removing heat from the CCAs to the chassis. Generally, the exterior surfaces of the chassis then convectively dissipate the heat into the ambient air surrounding the chassis, or the heat may be removed from the chassis using other means. As such, it is common for the chassis to be made entirely of a high thermal conductivity metal, such as aluminum or its alloys, so as to provide adequate mechanical support to, and heat transfer from, the CCAs. However, a cast metal chassis is often heavier than desirable, which makes three-dimensional (3D) printed metal chassis an attractive alternative.

Though they provide significant weight reduction, 3D printed metals have approximately 10-20% lower thermal conductivity than the raw metal material. Thus, a 3D printed metal chassis will have degraded thermal performance when compared to a machined metal chassis, assuming equivalent geometry. Also, composite structures or internal honeycomb shapes to minimize the weight of chassis may impact thermal performance of chassis adversely due to increased conduction resistance paths.

Therefore, devices and systems are desired that overcome challenges in the art, some of which are described above.

SUMMARY

Disclosed and described herein are devices and systems that remove heat from chassis (including 3D printed chassis) and/or eliminates the degradation of thermal performance of a 3D printed chassis that stems from low thermal conductivity between printed layers. As described and disclosed herein, oscillating heat pipe (OHP) evaporators are incorporated into chassis rails to transfer heat from circuit card assemblies to external fins or chassis base where OHP condensers are incorporated. In some instances, the heat is transferred to external fins of a chassis or otherwise removed from the chassis. When the chassis is a 3D printed chassis, the use of OHPs can increase a 3D printed aluminum or its alloys (e.g., AlSi10Mg) chassis' effective thermal conductivity significantly. Adding OHP to a machined chassis is difficult; however, using 3D printed aluminum allows for complex OHP designs and paths.

In one aspect, embodiments of a chassis for enclosing and cooling electronic equipment are described herein. For example, the chassis may comprise at least one side panel, said side panel having an interior and an exterior; at least one rail located on the interior of the at least one side panel, wherein the rail is configured to contact a portion of a circuit card assembly comprising electronic equipment; and an oscillating heat pipe (OHP), wherein a first portion of the OHP extends into the at least one rail and a second portion of the OHP extends into the at least one side panel on which the rail is located, wherein at least a portion of heat from operation of the electronic equipment passes through the circuit card assembly to the at least one rail, and from the at least one rail to the first portion of the OHP, from the first portion of the OHP to the second portion of the OHP, and from the second portion of the OHP to the that at least one side panel on which the rail is located where it is dissipated into an environment. In some instances, the chassis may be associated with a cold plate, and at least a portion of the OHP extends into the cold plate. Generally, the first portion of the OHP comprises an evaporator section of the OHP and the second portion of the OHP comprises a condenser section of the OHP.

In various embodiments, the at least one side panel of the chassis comprises at least two side panels, each of the two side panels having an interior and an exterior, and the chassis may further comprise a top panel, a bottom panel, a front panel, and a back panel. Generally, the portion of the circuit card assembly in contact with the rail comprises a portion of a frame of the circuit card assembly.

In some instances, the at least one side panel and the at least one rail located on the interior of the at least one side panel extend in a lengthwise dimension and the first portion and the second portions of the OHP extend into the at least one rail and the at least one side panel on which the rail is located in a widthwise dimension such that the OHP is substantially transverse to the at least one side panel.

Alternatively or optionally, the exterior of the at least one side panel further comprises one or more fins for cooling.

In some instances, a first U-shaped end of the first portion of the OHP is proximate to an inside edge or a top of the at least one rail and a second U-shaped end is proximate to the exterior of the at least one side panel or the at least one or more fins for cooling.

In some instances, at least a portion of the chassis is formed by three-dimensional (3D) printing or additive manufacturing. For example, in some instances the OHP channel is formed by 3D printing or additive manufacturing. In various aspects, the chassis is substantially formed of aluminum, titanium, copper, or their alloys, and the like.

Also described herein are embodiments of methods of forming a chassis for enclosing and cooling electronic equipment using three-dimensional (3D) printing or additive manufacturing. One instance of the method comprises forming, by a 3D printer, at least one side panel, said side panel having an interior and an exterior; forming, by the 3D printer, at least one rail located on the interior of the at least one side panel, wherein the rail is configured to contact a portion of a circuit card assembly comprising electronic equipment; and forming, by the 3D printer, an oscillating heat pipe (OHP), wherein a first portion of the OHP extends into the at least one rail and a second portion of the OHP extends into the at least one side panel on which the rail is located, wherein at least a portion of heat from operation of the electronic equipment passes through the circuit card assembly to the at least one rail, and from the at least one rail to the first portion of the OHP, from the first portion of the OHP to the second portion of the OHP, and from the second portion of the OHP to the that at least one side panel on which the rail is located where it is dissipated into an environment.

Further described herein are embodiments of a system for enclosing and cooling electronic equipment. One instance of the system comprises one or more circuit card assemblies (CCAs), each CCA comprising electronic equipment and a frame; and a chassis for enclosing and cooling the one or more CCAs during their operation, said chassis comprising: a top panel, a bottom panel, a front panel, a back panel, and two side panels, each side panel having an interior and an exterior, wherein the exterior of at least one of the side panels further comprises one or more fins for cooling; a plurality of rails located on the interior of each of the two side panels, wherein each rail is configured to contact a portion of the frame of each of the one or more CCAs, wherein the two side panels are parallel to one another and each of the side panels and the plurality of rails located on the interior of each of the two side panels extend in a lengthwise dimension; and an oscillating heat pipe (OHP), wherein an evaporator section of the OHP extends into at least one of the plurality of rails and a condenser section of the OHP extends into the side panel on which the rail is located, wherein a first U-shaped end of the first portion of the OHP is proximate to an inside edge or a top of the at least one rail and a second U-shaped end is proximate to the exterior of the at least one side panel or the at least one or more fins for cooling, wherein at least a portion of heat from operation of the electronic equipment passes through the one or more CCAs to the frame of the CCA, from the frame of the CCA to the rail, and from the rail to the evaporator section of the OHP, from the evaporator section of the OHP to the condenser section of the OHP, and from the condenser section of the OHP to the that side panel on which the rail is located where it is dissipated into an environment, and wherein and the evaporator section and the condenser sections of the OHP extend into the rail and the side panel on which the rail is located in a widthwise dimension such that the OHP is substantially transverse to the side panel.

Additional advantages will be set forth in part in the description which follows or may be learned by practice. The advantages will be realized and attained by means of the elements and combinations particularly pointed out in the appended claims. It is to be understood that both the foregoing general description and the following detailed description are exemplary and explanatory only and are not restrictive, as claimed.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Figure 1A:
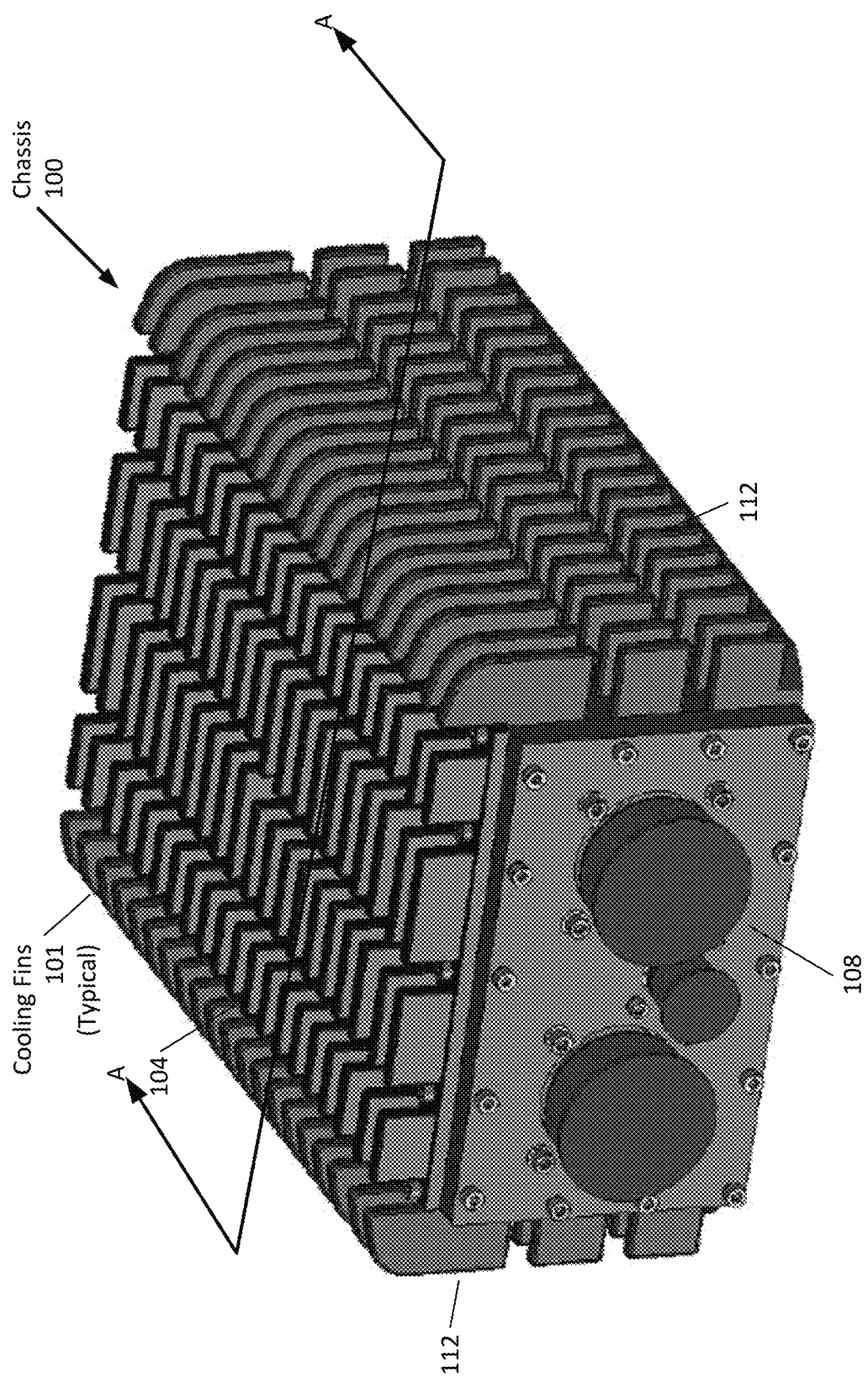
FIG. 1A is an external view of an exemplary chassis.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the Examples included therein and to the Figures and their previous and following description.

The embodiments disclosed herein facilitate providing an electronics system with a lightweight chassis having CCAs mounted therein. In some instances, the chassis may be an air-tight chassis to prevent infiltration of dirt, dust, debris, water and other substances that may affect the electronics contained therein. The disclosed embodiments of a chassis are configured to cool a CCA supported by the chassis. The devices, systems, and methods disclosed herein also facilitate conductively cooling a plurality of CCAs disposed within the chassis using a plurality of thermal pathways leading from the interior of the chassis to the exterior of the chassis. As such, the embodiments disclosed herein facilitate reducing thermal resistance in a processor or other electronic component of a CCA so as to mitigate a temperature rise in the electronic components during operation, which thereby may facilitate an increase of processor power capacity and/or lifetime. The devices, systems, and methods further facilitate providing a chassis that reduces electromagnetic interference (EMI) with a CCA disposed within the chassis. In this manner, the embodiments facilitate providing a chassis that has an effective mechanical support function using a lightweight 3D printed metal structure with an effective heat-removing function using thermal pathways incorporated into the 3D printed structure, and an effective EMI-reducing function using EMI-reducing materials incorporated into the structure, such that the chassis provides an improved performance over weight ratio. With these benefits, the embodiments facilitate enabling an avionics system to function more effectively in military environments having extreme temperature gradients and high shock/vibration.

FIG. 1A is an external view of an exemplary chassis 100. CCAs and/or other electronics are contained within the chassis 100. In the exemplary embodiment of FIG. 1A, chassis 100 has cooling fins 101 for heat dissipation by convection on at least four sides of the chassis 100. Heat generated by the CCAs and other electronic within the chassis 100 is conducted to the fins 101, where it is convectively dissipated into the surrounding environment. Though the exemplary chassis 100 of FIG. 1 shows fins 101 on at least four of its sides, it is to be appreciated that in other embodiments the chassis 100 may have cooling fins 101 on more or fewer than four sides, including some embodiments that have no cooling fins 100.

Figure 1B:
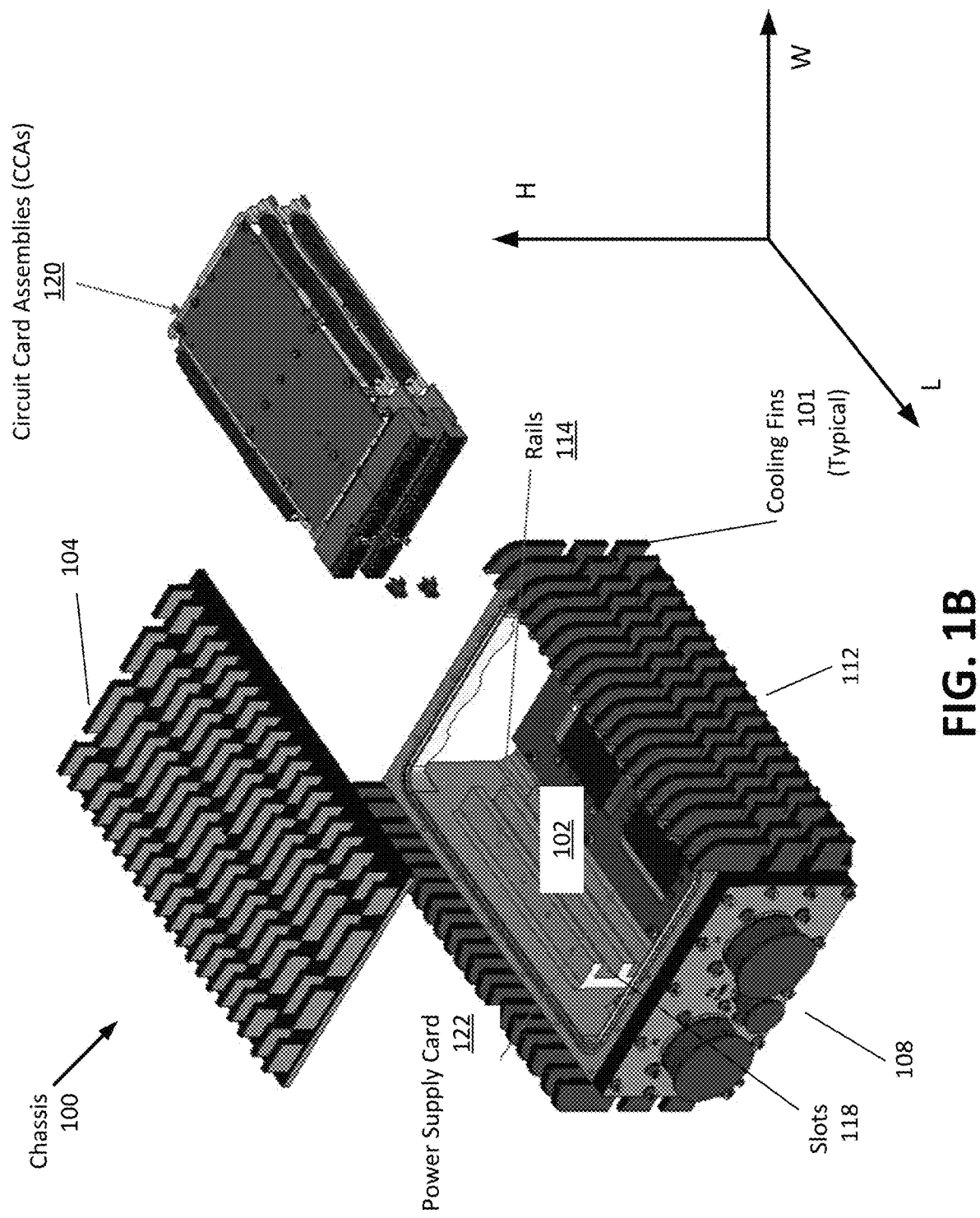
FIG. 1B is an exploded view of the chassis of FIG. 1A with top and back panels removed.

FIG. 1B is an exploded view of the chassis 100 of FIG. 1A with top and back panels removed. An interior space 102 of the chassis 100 is defined by an arrangement of panels, namely a removable top panel 104 (removed in FIG. 1B), a bottom panel 106 (not shown in FIGS. 1A and 1B), a front panel 108, a back panel (not shown in FIGS. 1A and 1B), and a pair of side panels 112. As used herein, the term "forward" and variations thereof are directional modifiers intended to indicate a direction from back panel toward front panel 108, and the term "rearward" and variations thereof are directional modifiers intended to indicate a direction from front panel 108 toward back panel. Similarly, as used herein, the term "upward" and variations thereof are directional modifiers intended to indicate a direction from bottom panel 106 toward top panel 104, and the term "downward" and variations thereof are directional modifiers intended to indicate a direction from top panel 104 toward bottom panel 106. As such, a lengthwise dimension L of chassis 100 extends through front panel 108 and back panel, a widthwise dimension W of chassis 100 extends through side panels 112, and a heightwise dimension H of chassis 100 extends through top panel 104 and bottom panel 106.

In the exemplary embodiment, chassis 100 has a plurality of internal rails 114 and a plurality of external fins 101 that are fabricated from a thermally conductive material, e.g., without limitation, an aluminum or its alloys material, titanium (and its alloys), copper, and the like. In some instances, fins 101 extend in heightwise dimension H and are spaced apart from one another in lengthwise dimension L alongside side panels 112, and in widthwise dimension W along back panel. In other instances, fins 101 may extend in lengthwise dimension L and are spaced apart from one another in heightwise dimension H alongside panels 112 and in widthwise dimension W along back, top, bottom and front panels. Rails 114 extend in lengthwise dimension L (front to back) and are spaced apart from one another in heightwise dimension H along side panels 112 so as to collectively define a plurality of slots 118 in the heightwise direction H. Rails 114 further extend inward in a widthwise dimension from an interior side of side panels 112 so as to form a connection point for securing the CCAs within the chassis 100. Each slot 118 is sized to receive a CCA 120 and/or a power supply card 122 in a slidable manner for suitably retaining CCAs 120 within interior space 102, e.g., without limitation, via suitable wedge lock mechanisms of CCAs 120. In some embodiments, rather than only being disposed on side panels 112, rails 114 may also be disposed on front panel 108 and back panel. Moreover, fins 101 may be disposed on any suitable one (or combination) of top panel 104, front panel 108, back panel, and side panels 112 in other embodiments. Alternatively, while chassis 100 is shown as having a particular quantity of rails 114 and fins 101 in the exemplary embodiment, chassis 100 may have any suitable quantity of rails 114 and fins 101 in other embodiments. Furthermore, while FIGS. 1A and 1B shows the fins 101 running in a widthwise and a heightwise dimension, it is to be appreciated that in other embodiments that fins 101 may run in the lengthwise dimension L (front to back) and are spaced apart from one another in the heightwise dimension and/or widthwise dimension.

In the exemplary embodiment shown in FIGS. 1A and 1B, top panel 104, bottom panel 106, front panel 108, back panel, and side panels 112 are joined together to completely enclose CCAs 120 such that interior space 102 is sealed. In some instances, the seal is in an air-tight and/or watertight manner. Thus, chassis 100 facilitates protecting CCAs 120 from debris, extreme temperature, moisture, and/or electromagnetic interference (EMI) as set forth in more detail below. In alternative embodiments, however, chassis 100 may permit ambient airflow through interior space 102 and over CCAs 120. As used herein, the term "air-tight" refers to chassis 100 being sealed such that airflow into or out of interior space 102 is substantially mitigated. Optionally, in other embodiments, chassis 100 may not be air-tight but, rather, may be suitably configured to substantially mitigate an inflow of dust, sand, and/or other airborne particulates.

Figure 1C:
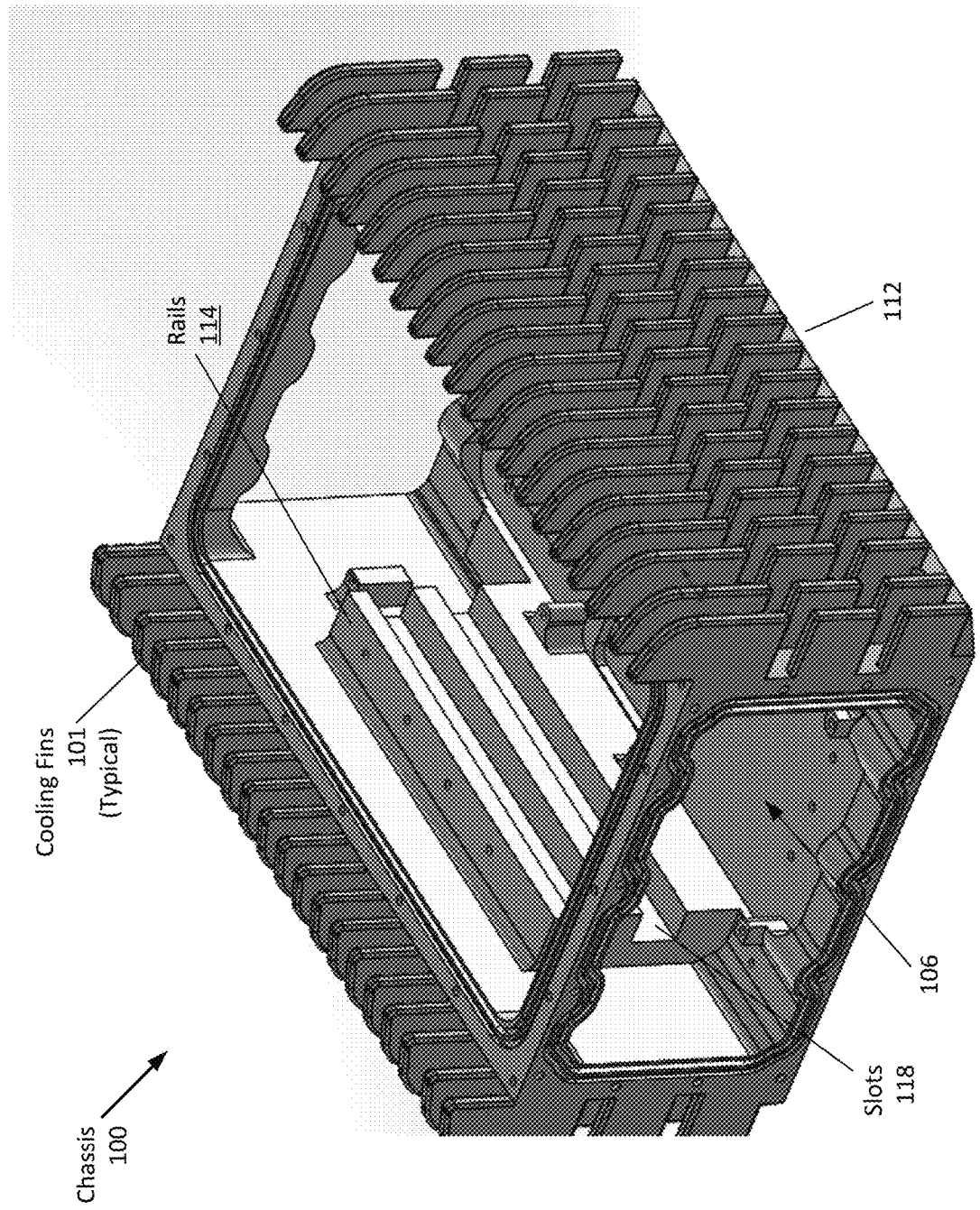
FIG. 1C is an illustration of the embodiment of a chassis shown in FIGS. 1A and 1B, with the top, front, and back panels removed.

FIG. 1C is an illustration of the embodiment of a chassis 100 shown in FIGS. 1A and 1B, with the top 104, front 108 and back panels removed. This illustration shows the rails 114, cooling tins 101 and the bottom panel 106. The rails 114 are in contact with the CCAs 120 and, as such, conduct heat from the CCAs 120 to the cooling fins 101, Where the heat is transferred by convection to the environment. In one embodiment, heat transfer from the rails 114 to the cooling fins 101 is improved by the use of oscillating heat pipes (OHPs) where OHP evaporators are incorporated into the chassis' rails 114 and OHP condensers are incorporated into side panels 112 and/or proximate to the cooling fins 101. The OHP is used to reject heat to the environment by one or more of natural convection, forced convection (fan cooling), radiation, and/or conduction cooling to a cold plate.

Figure 2:
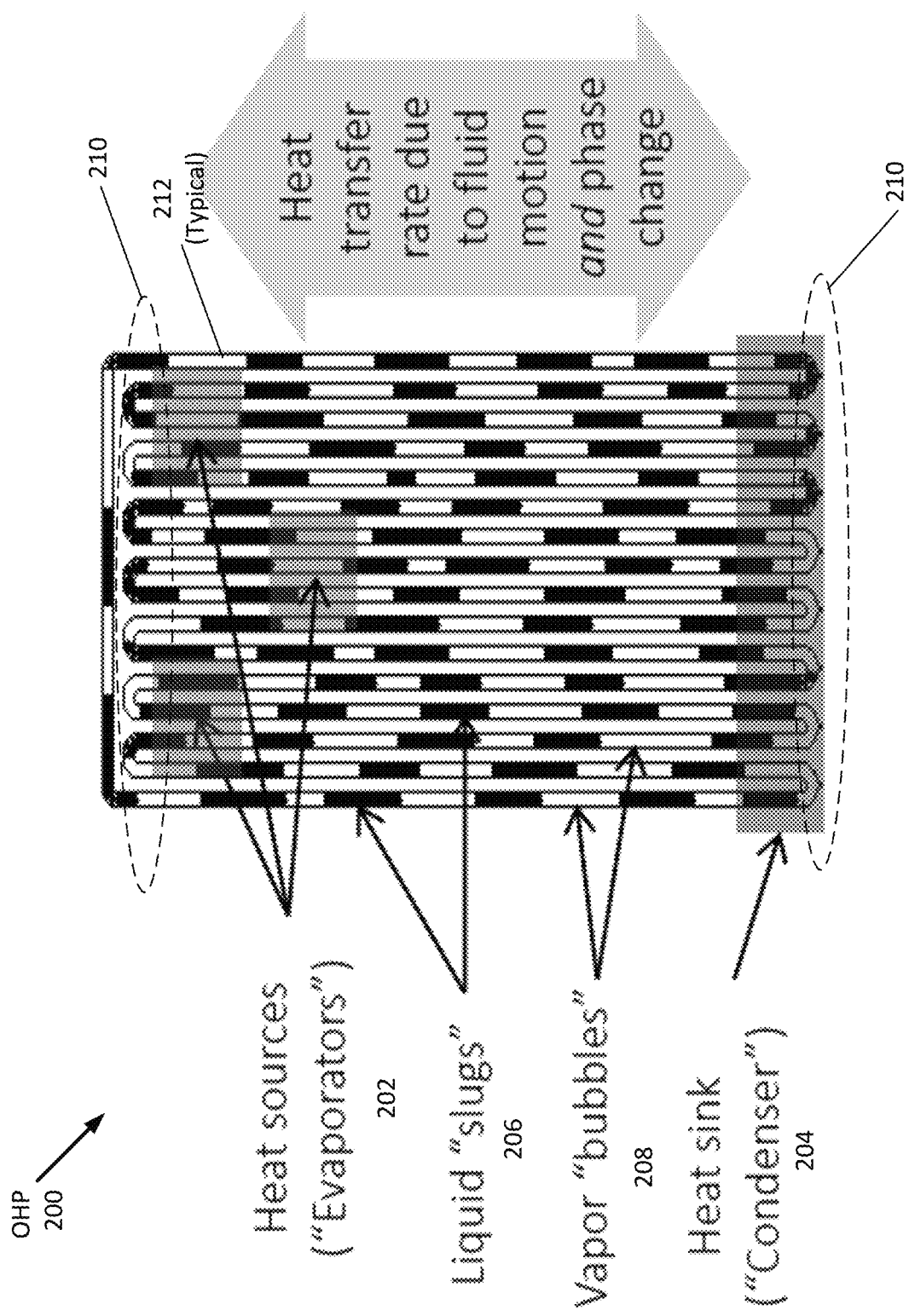
FIG. 2 is an illustration of an exemplary oscillating heat pipe (OHP)

FIG. 2 is an illustration of an exemplary OHP 200. As shown in the illustration, an OHP 200 comprises an evaporator section 202 and a condenser section 204. Heat transfers from the evaporator section 202 to the condenser section by way of fluid "slugs" 206 and phase change (vapor bubbles 208). The rate of heat transfer of the OHP is based on the rate of sensible heat removal by fluid motion and the rate of phase change. An OHP 200 is a passive, robust and highly efficient two-phase heat transfer device that is characterized by high thermal conductivity and heat flux and wickless and pressure-driven flow. The OHP 200 can be formed integral to a functional, mechanical structure, and is producible in complex 3D shapes, particularly when formed using 3D printing. The mechanical properties of the OHP 200 can be tailored for the application.

Generally, the OHP 200 is comprised of a single channel formed in a serpentine configuration of a plurality of U-shaped end sections 210, which comprise the evaporator 202 and condenser 204, and elongated leg sections 212. An OHP 200 can be integrated into a larger whole (e.g., rails 114, side panels 112, fins 101, and the like) by forming channels in the whole rather than inserting a tube or other separate object into the whole.

Figure 3:
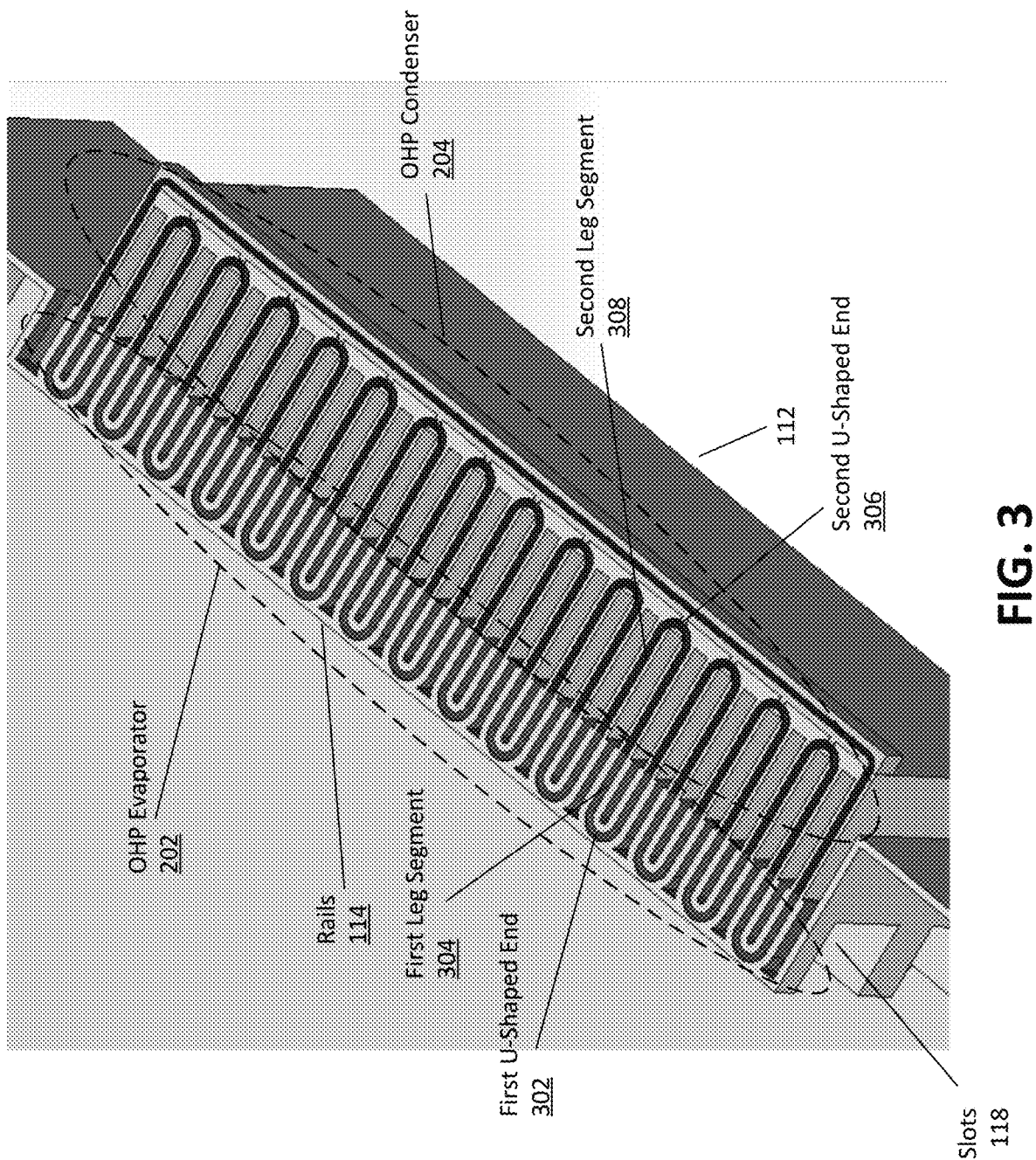
FIG. 3 is an illustration of a section of a chassis for enclosing and cooling electronic equipment.

FIG. 3 is an illustration of a section of a chassis 100 for enclosing and cooling electronic equipment. The chassis 100 is comprised of one or more side panels 112, each side panel 112 having an interior and an exterior, and at least one rail 114 on the interior of at least one of the one or more side panels 114. Further comprising the embodiment of FIG. 3 is an oscillating heat pipe (OHP) 200, having an evaporator section 202 and a condenser section 204, wherein at least a portion of the OHP evaporator 202 is integrated into a least a portion of one of the rails 114. The serpentine channels of the OHP 200 connect the rails 114 and the cooling fins 101 or exterior side panel 112 portion. The condenser section 204 of the OHP 200 is in contact with or proximate to the exterior portion of the side panel 112 and/or cooling fins 101. At least a portion of the heat from the electronic equipment of the CCA 120 passes through the frame of the CCA 120 to the rail 114 and from the rail 114 to the evaporator section 202 of the OHP 200, from the evaporator section 202 of the OHP to the condenser section 204 of the OHP 200, and to/through the at least one side panel 112, where it is dissipated to the environment. As noted herein, in some instances the side panel 112 further comprises cooling fins 101 on its external surface for improved heat dissipation and the condenser section 204 of the OHP 200 is in contact with or proximate to the cooling fins 101. As shown in FIG. 3, the OHP 200 is at least partially located within the at least one rail 114 and is transverse (i.e., generally orthogonal) to the heightwise dimension a the at least one side panel 112. Generally, the chassis 100 is substantially comprised of materials that have good heat transfer properties, such as aluminum or its alloys.

As can be seen in FIG. 3, each thermal pathway of the OHP 200 has a generally U-shaped profile with a first U-shaped end 302, a first leg segment 304, a second U-shaped end 306, a second leg segment 308, and so on. First U-shaped end 302 is disposed in and near the inside edge and top of rails 114, and first leg segment 304 extends outward, and transverse to side panels 112, from first end 302 to second U-shaped end 306 adjacent external face of side panel 112 and/or fins 101 such that a plurality of first U-shaped ends 302 are located within a single rail 114 and adjacent or proximate to one side of a CCA 120. Similarly, a plurality of second U-shaped ends 306 are disposed near side panel 112 and/or fins 101, and joins the first leg segment 304 with the second leg segment 308. Second leg segment 308 extends inward from second U-shaped end 306 back to another of the first U-shaped ends 302. In some instances, the second U-shaped end 308 may span one or a plurality of fins 101 that run in a heightwise or a lengthwise dimension on the side panels 112. One or more first U-shaped ends 302 form OHP evaporator 202, and one or more second U-shaped ends 306 form OHP condenser 204.

During operation, each CCA 120 generates heat, and heat is removed from CCAs 120 in the following manner. Heat from each CCA 120 is conductively transferred to rails 114 between which each CCA 120 is retained. Heat from rails 114 is then conductively transferred to OHP evaporator 202, and heat from OHP evaporator 202 is then conductively transferred to first leg segments 304 of thermal pathways by virtue of first leg segments providing a pathway for liquid slugs 206 and vapor bubbles 208 from the evaporator 202 to the OHP condenser 204, where heat is transferred from the condenser 204 to the exterior of the side panel 112 and/or to cooling fins 101. Because fins 101 are on the exterior of chassis 100, fins 101 are cooled by the ambient air surrounding chassis 100. Fins 111 therefore conductively cool side panels 112, which in turn conductively cools the OHP condenser 204 by virtue of being in conductive heat transfer with fins 101. In this manner, U-shaped condenser ends 306 are cooled by the ambient air surrounding chassis 100. More specifically, for each thermal pathway, the condenser section 204 is maintained at a cooler temperature than the evaporator section 202 during operation of CCAs 120.

Heat transferred to evaporator 202 from the rails causes a portion of the working liquid within first U-shaped end 302 to evaporate such that the vapor bubbles 208 and remaining liquid slugs 206 travels along the first leg segment 304 toward second U-shaped end 306 due to second U-shaped end being at a cooler temperature than first U-shaped end 302 and first leg segment 304. Within second U-shaped end 306, the at least a portion of the vapor bubbles 208 condense due to the cooler temperature of second U-shaped end 306, and the remaining (cooled) vapor bubbles 208 and liquid slugs 206 travel inward through the second leg segments 308 to another of the first U-shaped ends 302 to again receive heat and (a portion) be evaporated. When the vapor condenses within second U-shaped end 306, second U-shaped end 306 conductively transfers heat to exterior surface of side panel 112, which in turn conductively transfers heat to fins 101. Heat from fins 101 is then convectively transferred to the ambient air surrounding chassis 100, thereby completing the heat transfer path from CCAs 120 within chassis 100 to the ambient air surrounding chassis 100. This heat transfer cycle continuously repeats itself during the operation of CCAs 120 such that thermal pathways function to actively cool CCAs 120.

As shown herein, first leg segment 304 and second leg segment 308 extend widthwise from the first U-shaped ends 302 of the evaporator 302 to the second U-shaped ends 306 of the condenser 204, and transverse to the heightwise dimension of the side panels 112.

Figure 4A:
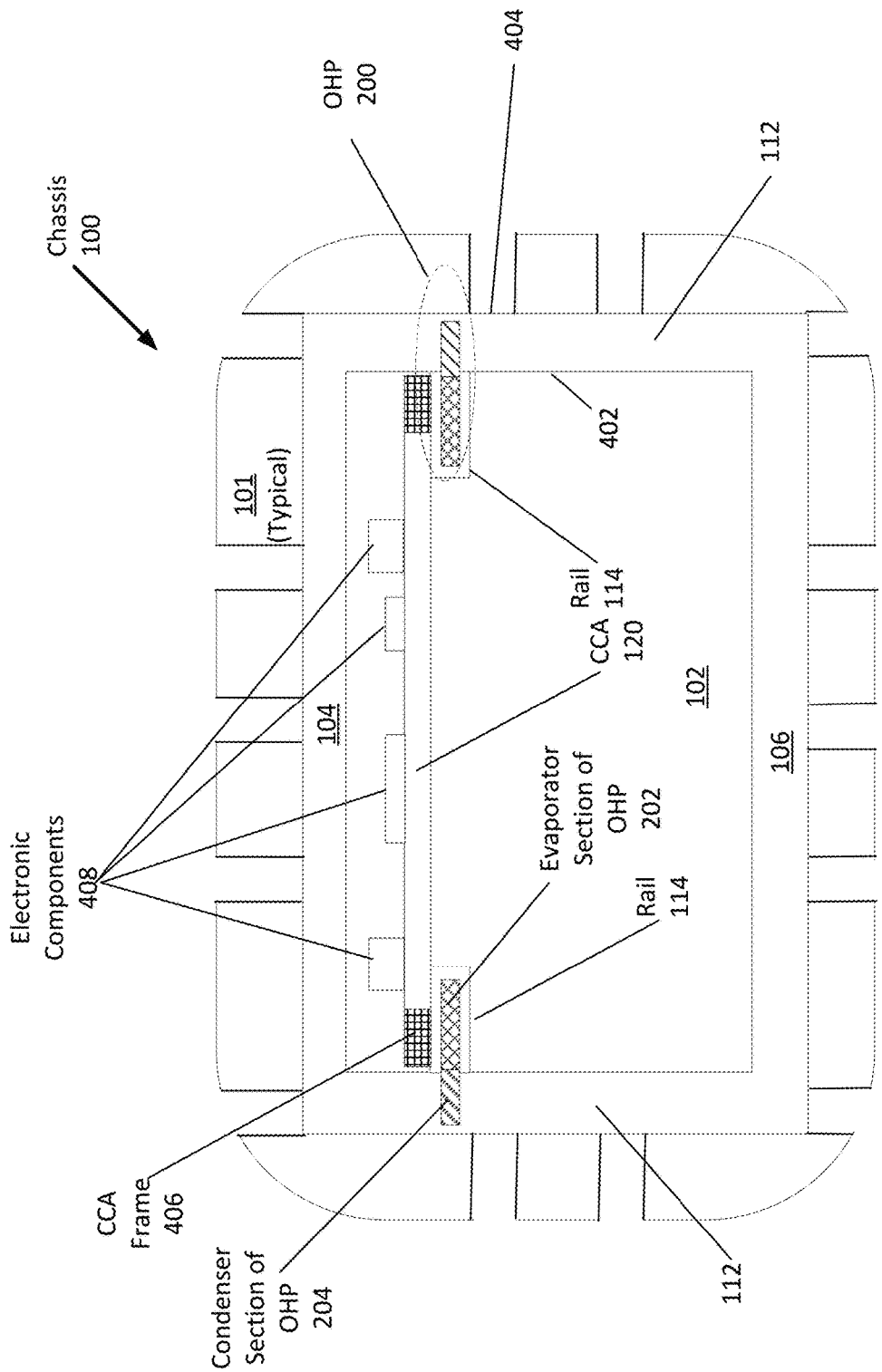
FIGS. 4A-4D are schematic cross-sectional views of a portion of chassis taken along line A-A of FIG. 1A.

FIG. 4A is a schematic cross-sectional view of a portion of chassis 100 taken along line A-A of FIG. 1A. In the exemplary embodiment, each side panel 112 has an interior portion 402 and an exterior portion 404. In the embodiment shown in FIG. 4A, the side panels 112, top 104 and bottom 106 plates further comprise cooling fins 101. In some embodiments, fins 101 are integrally formed with and project outwardly from the exterior of side panels 112, top plate 104, and bottom plate 106, and rails 114 may be integrally formed with and project inwardly (widthwise) from interior 402 of side panels 112. A CCA 120 is substantially in contact with rails 114 through at least a portion of the CCA's frame 406. In some instances, the CCA 120 may be suitably fastened to at least one of the rails 114. The CCA 120 comprises electronic components 408, which produce heat during operation. In some embodiments, chassis 100 may not include fins 101, or fins may only be located on fewer than all of top plate 104, side panels 112, bottom panel 106, front panel 108 and back panel. As shown in FIG. 4A, OHP 200 is integrated into rails 114 and side panels 112, with the evaporator portion 202 of the OHP 200 proximate to the CCA 120 and/or the frame 406 and the condenser portion 204 of the OHP 200 proximate to the wall exterior 404 and/or cooling fins 101. While the chassis 100 embodiment of FIG. 4A shows only one CCA 120 mounted on one set of rails 114, it is to be appreciated that more than one CCA 120 can be mounted in a single chassis 100 on a suitable number of sets of rails 114. In some instances, each rail 114 has its own OHP 200. In other instances, there may be fewer OHPs 200 than rails 114.

Figure 4B:
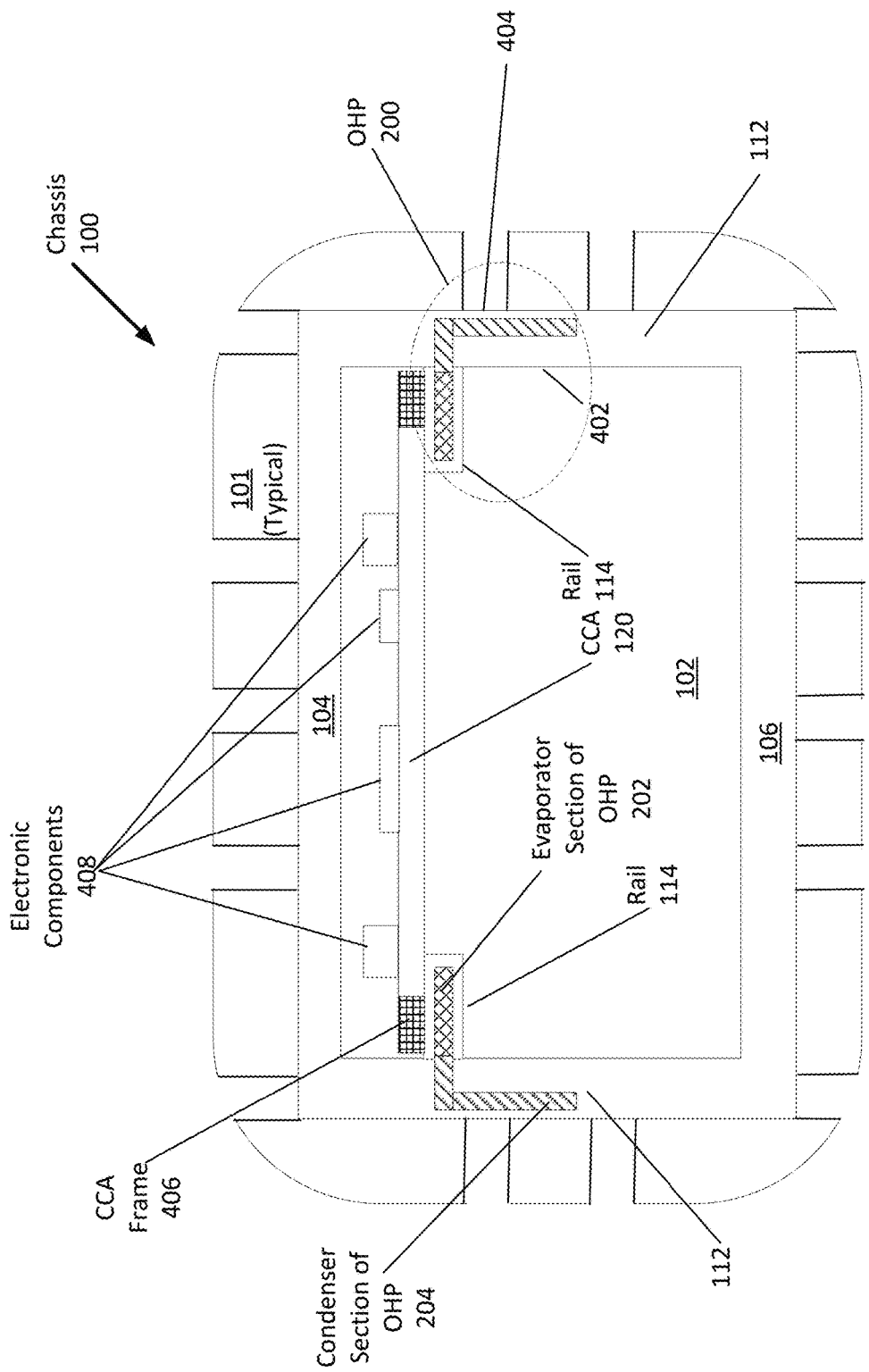

FIG. 4B is an alternate embodiment of the portion of chassis 100 taken along line A-A of FIG. 1A. In this version, at least one OHP 200 is configured such that at least a portion of the OHP 200 extends into and in a second direction within the sidewall 112. For example, the OHP 200 may extend upwardly and/or downwardly in side panels 112, or in any other direction in the sidewalls 112 including upward, downward, toward the rear, toward the front, at an angle in the sidewall, etc. (in FIG. 4B, the OHP is shown only extending downwardly in the sidewall 112, but it is to be appreciated that in various configurations a portion of any OHP 200 in the chassis 100 may extend in any direction in the sidewall 112). All or a portion of the OHP 200 extending in sidewall 112 may comprise the condenser portion 204 of the OHP 200.

Figure 4C:
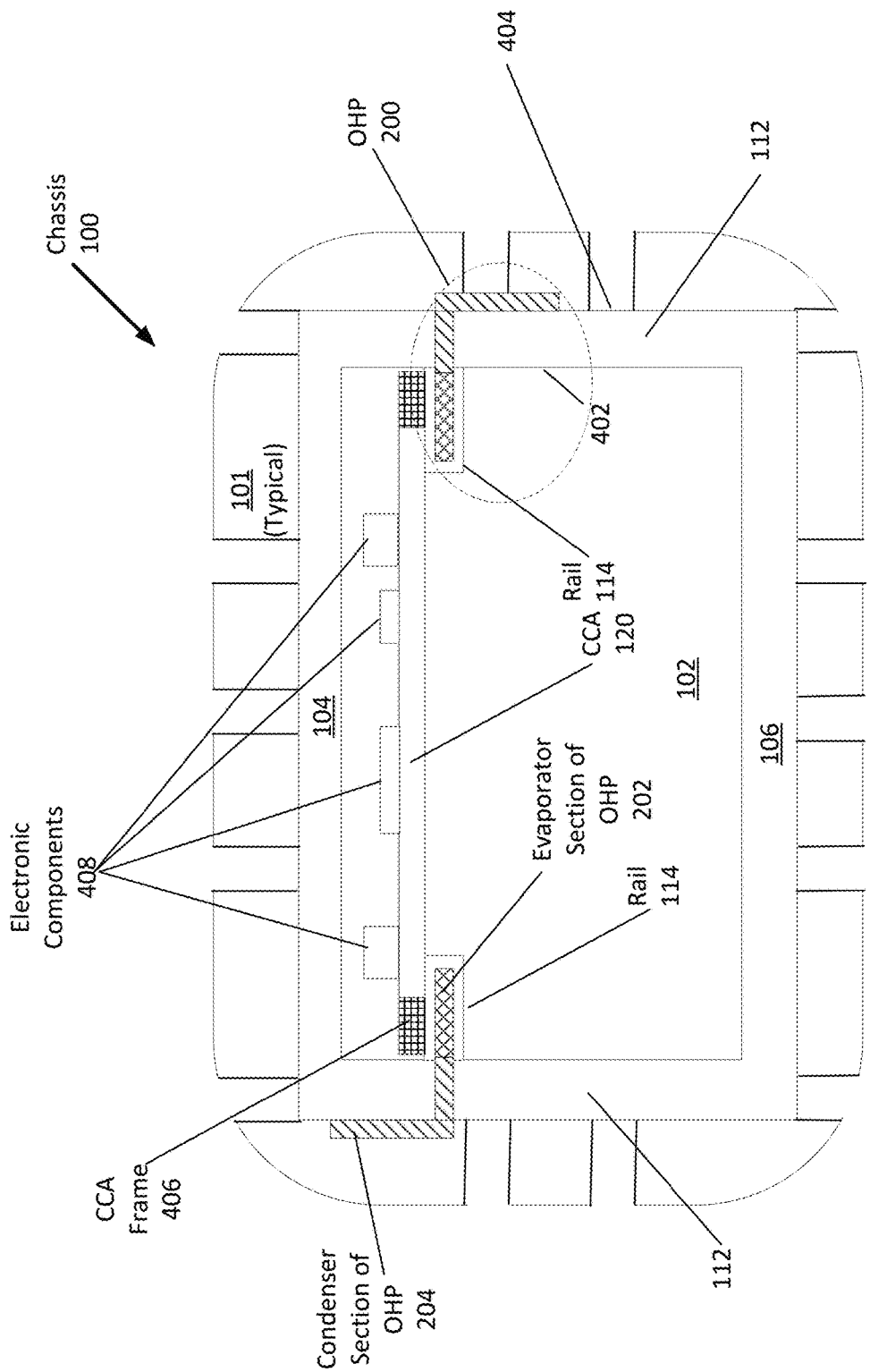

FIG. 4C is an alternate embodiment of the portion of chassis 100 taken along line A-A of FIG. 1A. In this version, at least one OHP 200 is configured such that at least a portion of the OHP 200 extends through the sidewall 112. Once extended through the sidewall 112, a portion of the OHP 200 may further extend in any direction (e.g., upward, downward, toward the rear, toward the front, straight out from the sidewall 112, at an angle to the sidewall, either upwardly and/or downwardly in side panels 112 (in FIG. 4B, the OHP 200 is shown only extending upwardly and downwardly external to the sidewall 112, but it is to be appreciated that in various configurations any portion of OHP 200 in the chassis 100 may extend in any direction external the sidewall 112). All or a portion of the OHP 200 extending external to sidewall 112 may comprise the condenser portion 204 of the OHP 200. In some instances, the portion of the OHP 200 external to the sidewall 112 is integrated into and/or passes through the fins 101.

Figure 4D:
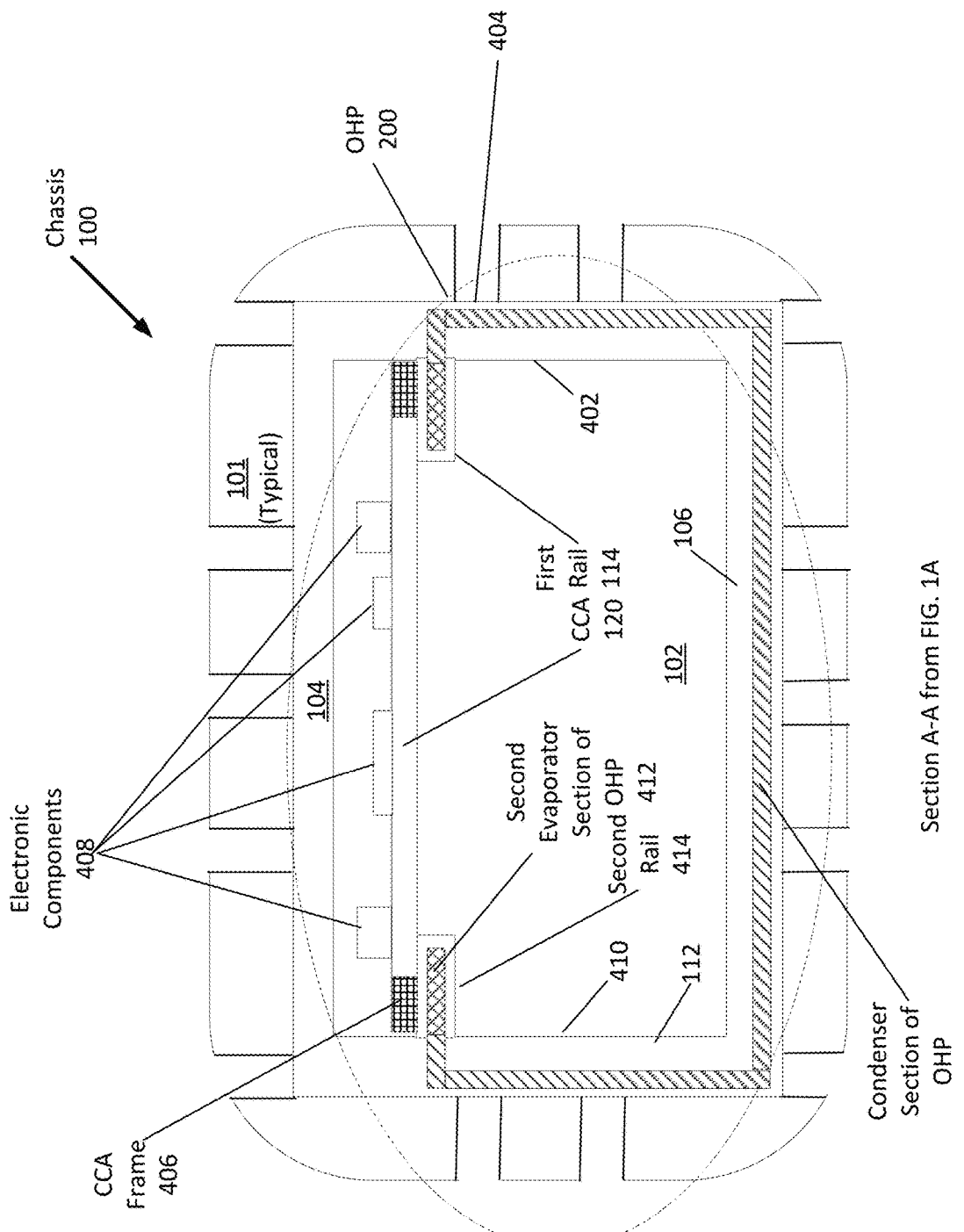

FIG. 4C is yet another alternate embodiment of the portion of chassis 100 taken along line A-A of FIG. 1A. In this version, at least one OHP 200 is configured such that the OHP 200 has two evaporator sections, a first 202 at least partially located in a first rail 114 on a first interior wall 402 of the chassis 100 and a second evaporator section 412 located in a second rail 414 on a second interior wall 410 opposite the first interior wall 402. The OHP 200 extends through the bottom 106, front 108, back or top 104 panels of the chassis 100 from the first side to the second side, and has a middle condenser portion 204 that connects the two evaporator sections 202, 412. Though not shown in FIG. 4D, in other instances, the OHP 200 may extend through the sidewalls 112 and run external to the sidewalls 112, top panel 104, bottom panel 106, front panel 108 and/or back panel from the first side to the second side of the chassis 100. All or a portion of the OHP 200 extending external to sidewalls 112 may comprise the condenser portion 204 of the OHP 200. In some instances, the portion of the OHP 200 external to the sidewalls 112 is integrated into and/or passes through the fins 101.

Figure 5A:
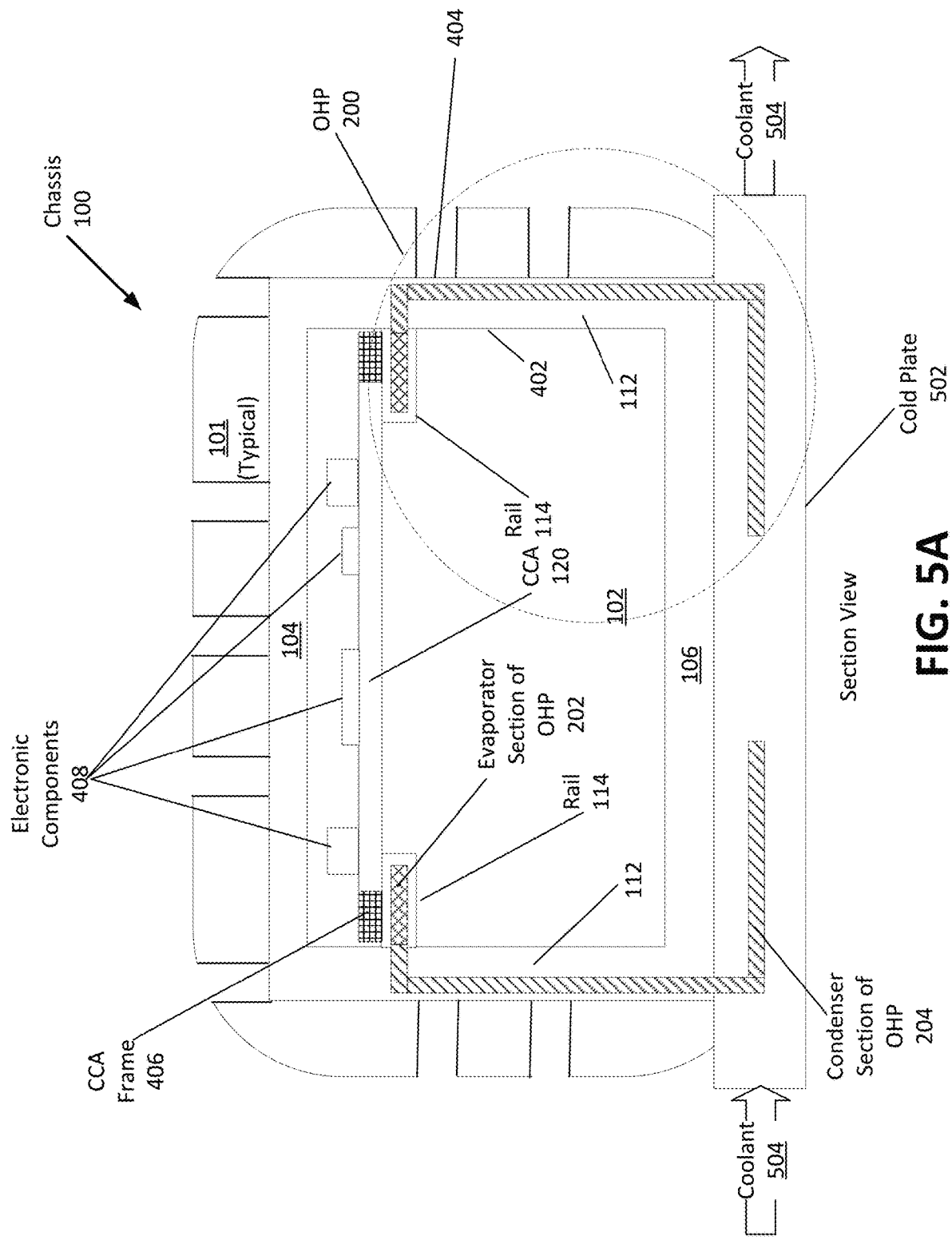
FIGS. 5A-5C are section views of a chassis that further comprises a cold plate.
Figure 5B:
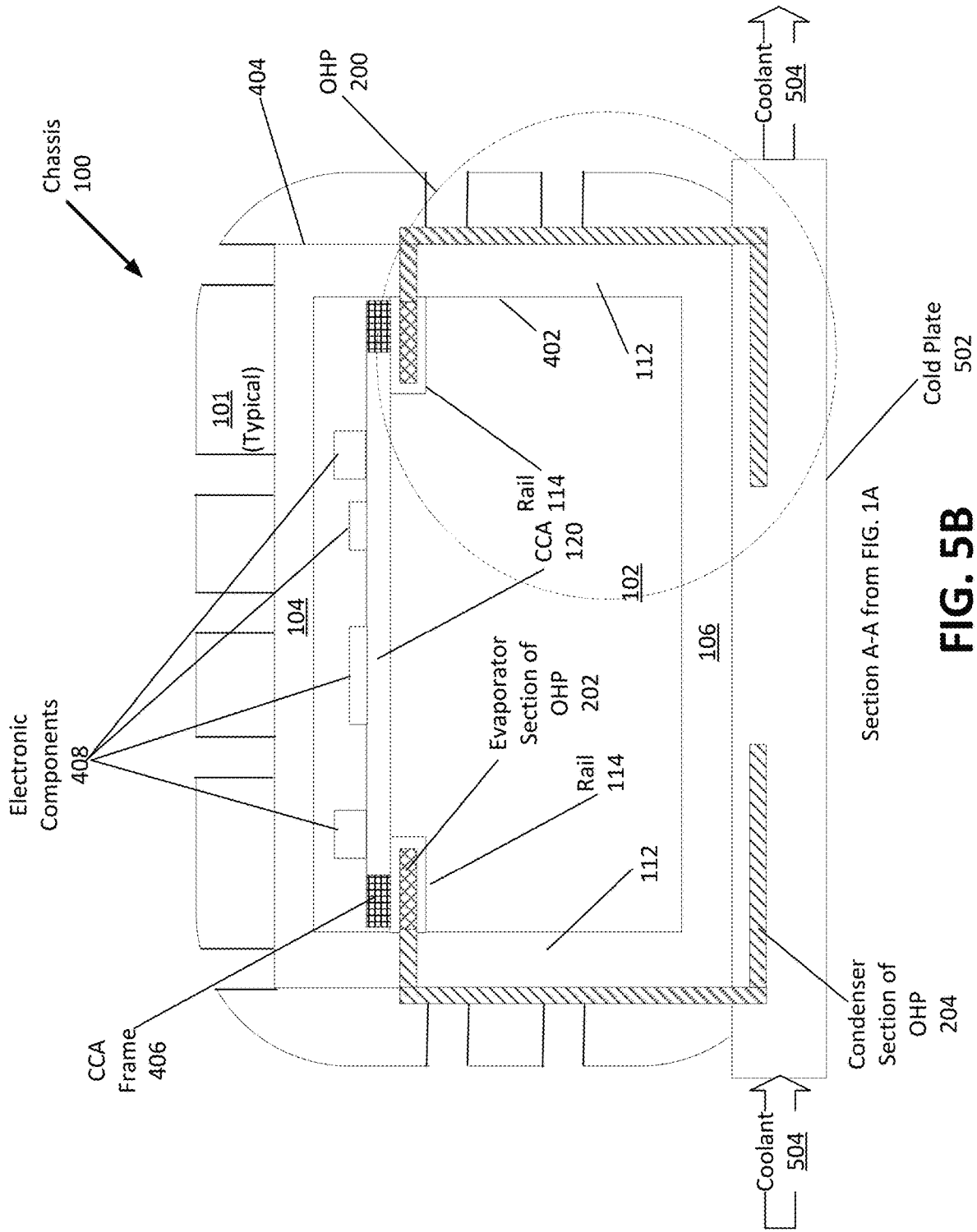
Figure 5C:
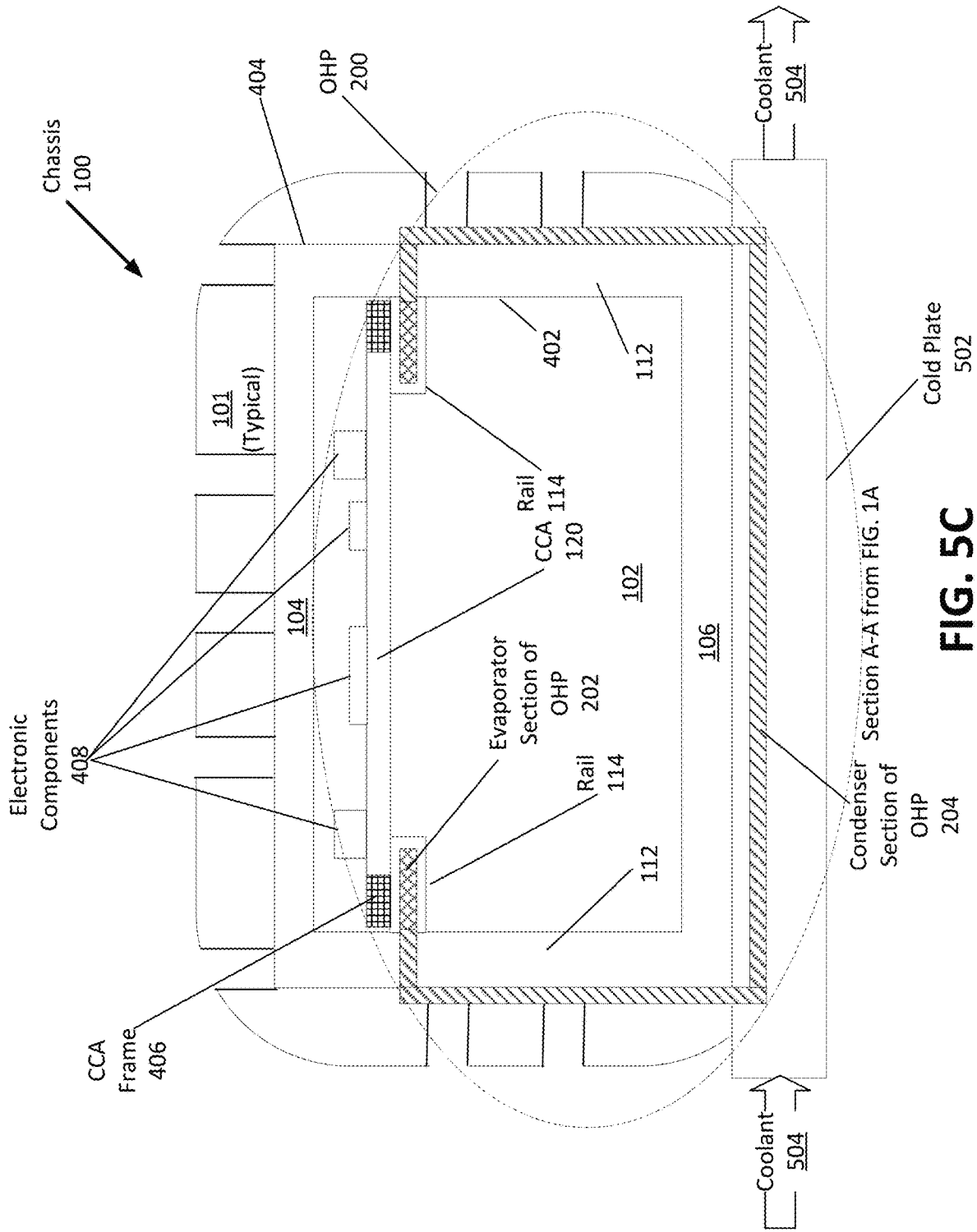

FIGS. 5A-5C illustrate section views of a chassis 100 that further comprises a cold plate 502. At least a portion of the condenser section 204 of the OHP 200 extends into the cold plate 502, where a coolant 502 is used to remove heat from the condenser section 204. The coolant 504 may a be a fluid such as air, water, and the like, or any other fluid, solid, or semi-solid capable of receiving heat from the OHP 200. In the embodiment shown in FIGS. 5A-5C, the cold plate 502 is shown at the bottom of the chassis 100, but it is to be appreciated that the cold plate 502 may be located at any position relative to the chassis 100 including the top, side, front, back, or even within the chassis 100. In the embodiment shown in FIG. 5A, at least a portion of at least one of the OHPs 200 extends into the sidewall 112 and into the cold plate 502, where heat is removed form the OHP 200. In the embodiment shown in FIG. 5B, at least a portion of at least one of the OHPs 200 extends into and through the sidewall 112 and into the cold plate 502, where heat is removed from the OHP 200. In this embodiment, in some instances, the portion of the OHP 200 external to the sidewalls 112 is integrated into and/or passes through the fins 101. In the embodiment shown in FIG. 5C, similar to FIG. 4D, above, at least one OHP 200 is configured such that the OHP 200 has two evaporator sections, a first 202 at least partially located in a first rail 114 on a first interior wall 502 of the chassis 100 and a second evaporator section 512 located in a second rail 514 on a second interior wall 510 opposite the first interior wall 502. The OHP 200 extends through a cold plate 502 that may be located proximate the bottom 106, front 108, back or top 104 panels of the chassis 100 (or even within the chassis 100) from the first side to the second side of the chassis 100, and has a middle condenser portion 204 that connects the two evaporator sections 202, 512, which is at least partially located within the cold plate 502. As shown in FIG. 5C, in some instances, the OHP 200 may extend through the sidewalls 112 and run external to the sidewalls 112, top panel 104, bottom panel 106, front panel 108 and/or back panel through the cold plate 502 and from the first side to the second side of the chassis 100. In some instances, the portion of the OHP 200 external to the sidewalls 112 is integrated into and/or passes through the fins 101. Though not shown in FIG. 5C, in other instances, the OHP 200 may extend into the sidewalls 112 and run through the sidewalls 112, top panel 104, bottom panel 106, front panel 108 and/or back panel, through the cold plate 502, and from the first side to the second side of the chassis 100

In some embodiments, at least some of top panel 104, bottom panel 106, front panel 108, back panel, side panels 112, fins 101, OHP 200, and rails 114 may be integrally formed together using a molding process such as, for example, a casting process (for panels that are at least in part fabricated from a metallic material), and/or 3D printing. In other embodiments, at least some of top panel 104, bottom panel 106, front panel 108, back panel, side panels 112, fins 101, cap 200, and rails 114 may be molded, 3D printed (or otherwise formed) separately from, and subsequently joined to, one another using suitable mechanical joints and/or bonding agents such as, for example, solder, adhesive, screws, clips, wedge-locks, and the like. Optionally, chassis 100 may include a structural framework (or skeleton) to which top pan& 104, bottom panel 106, front panel 108, back panel, side panels 112, fins 101, OHP 200, and rails 114 are joined. For example, without limitation, chassis 100 may have a metallic or composite skeleton defining windows over which (or pockets into which top panel 104, bottom panel 106, front panel 108, back panel, side panels 112, fins 101, OHP 200, and rails 114 are to be inserted or otherwise coupled.

Though 3D printing provides significant weight reduction, 3D printed metals generally have approximately 10-20% lower thermal conductivity than the raw metal material. Thus, a 3D printed metal chassis will have degraded thermal performance when compared to a machined metal chassis, assuming equivalent geometry. However, by incorporating the OHP 200 into the rails 114, side panels 112 and/or fins 101 of the chassis 100, degradation of thermal performance of a 3D printed chassis that stems from low thermal conductivity between printed layers is eliminated. Incorporating OHP evaporators 202 into the chassis rails 114 to transfer heat from circuit cards 120 to OHP condensers 204 in the external side panels 112 and/or fins 101 can increase a 3D printed aluminum alloy chassis' effective thermal conductivity significantly. For example, using the OHP 200 can increase the thermal conductivity (k value) of the chassis 100 from approximately 114 Watts per meter-Kelvin (W/mK) for an aluminum alloy 3D printed chassis without an OHP 200 to approximately 914 W/mK (or more) for a 3D printed chassis 100 that includes an OHP 200. Generally, the manufacturing process for 3D printed chassis 100 with OHP 200 comprises (1) 3D printing with OHP channels, (2) charging and degassing, (3) pinch off, and (4) completion.

In the exemplary embodiment, the OHP 200 in each rail 114 includes a plurality of separate thermal pathways embedded therein, and each thermal pathway is situated in conductive heat transfer, e.g., without limitation, direct, physical contact, with side panels 112, fins 101 and rails 114 such that thermal pathways extend through side panel 112 to external portion 404 and/or fins 101 of side panel 112 from rails 114. Notably, each thermal pathway may be a single, unitary conductive member or a plurality of separate conductive members that are coupled together. For example, each channel of the OHP 200 may comprise a separate thermal pathway. Heat may be collected from the CCAs by the U-shaped end sections 210 of the evaporator 202 integrated into the rails 114, travel through the thermal paths created by each elongated leg section 212 of the OHP 200 by use of the liquid slugs 206 and vapor bubble 208, and then be released from the U-shaped segments 210 of the OHP 200 that form the condenser section 204 proximate to the exterior 404 of the side panels 112 and/or the fins 101. Alternatively, rather than utilizing a plurality of separate thermal pathways, side panel 112 may utilize only one thermal pathway or a single network of interconnected thermal pathways to facilitate enabling chassis 100 to function as described herein. Moreover, the shape of each thermal pathway may be selected to suit desired heat transfer properties and available space.

Optionally, chassis 100 is configured to reduce electromagnetic interference (EMI). In some embodiments, the existing structures of the chassis embodiments set forth above, e.g., without limitation, thermal pathways or the skeleton of chassis 100, effectively reduce EMI. In other embodiments, it is beneficial to incorporate additional EMI-reducing structures into the chassis embodiments set forth above. Suitable options for adding EMI-reducing structures to chassis 100 include: metallization; overlapping joints; embedded wire mesh; cage structure; metal foils; chopped metal strands, e.g., without limitation, copper, in the filler material of composite segment; gaskets made of silver-plated aluminum in fluorosilicone; gaskets having conductive fabric over foam closures; beryllium copper (BeCu) finger stock joints; or vents with EMI air filters. In one particular example, the panels of chassis 100 that utilize composite material are coated internally with a metallic material, or have an embedded metallic screen that effectively functions as a Faraday cage. In another example, the joints between adjacent panels are provided with interlocking lips, e.g., without limitation, a tongue-and-groove connection, that facilitate a labyrinth-type seal, and/or the joints are provided with electrically conductive O-rings. Moreover, in some embodiments, the panels that utilize composite material suitably include embedded metal inserts that facilitate fastening the panels together at the joints, e.g., without limitation, via screws that are closely spaced together to maintain a continuous metal-to-metal contact along the joints.

The above-described embodiments facilitate providing an electronics system with a lightweight chassis having CCAs mounted therein. The embodiments further facilitate providing an air-tight chassis that has predominantly nonmetallic panels and is configured to cool a CCA supported by the chassis. The devices, systems, and methods disclosed above also facilitate conductively cooling a plurality of CCAs disposed within a composite-paneled chassis using a plurality of thermal pathways leading from the interior of the chassis to the exterior of the chassis. As such, the embodiments disclosed herein facilitate reducing thermal resistance in a processor of a CCA so as to mitigate a temperature rise in the processor during operation, thereby facilitating, an increase of processor power capacity. The devices, systems, and methods further facilitate providing a composite-paneled chassis that reduces electromagnetic interference (EMI) with a CCA disposed within the chassis. As such, the embodiments facilitate providing a chassis that has an effective mechanical support function using a lightweight composite structure, an effective heat-removing function using thermal pathways incorporated into the composite structure, and an effective EMI-reducing function using EMI-reducing materials incorporated into the composite structure, such that the chassis provides an improved performance over weight ratio. With these benefits, the embodiments facilitate enabling an avionics system to function more effectively in military environments having extreme temperature gradients and high shock/vibration.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A chassis for enclosing and cooling electronic equipment, said chassis comprising:
   a top, a bottom, and two side panels that define an interior space, wherein each side panel has an interior side, an exterior side, a length and a height;
   at least one rail located on the interior side of at least one of the side panels, wherein the rail extends inwardly toward the interior space and horizontally along the length of the interior side of the side panel, wherein the rail is configured to contact only a portion of a circuit card assembly comprising electronic equipment; and
   an oscillating heat pipe (OHP), wherein a first portion of the OHP extends inwardly through the rail toward the interior space and is fully enveloped by the at least one rail, and extends toward the exterior side of the at least one of the side panels and into the at least one of the side panels, and a second portion of the OHP orthogonal to the first portion extends into the height of and is fully enveloped by the at least one side panel on which the rail is located, wherein at least a portion of heat from operation of the electronic equipment passes through the circuit card assembly to the at least one rail, and from the at least one rail to the first portion of the OHP, from the first portion of the OHP to the second portion of the OHP, and from the second portion of the OHP to the at least one side panel on which the rail is located where it is dissipated into an environment.

2. The chassis of claim 1, wherein the chassis further comprises a cold plate, and wherein at least a portion of the OHP extends into the cold plate.

3. The chassis of claim 1, wherein the chassis further comprises a front panel, and a back panel.

4. The chassis of claim 1, wherein the portion of the circuit card assembly in contact with the rail comprises a portion of a frame of the circuit card assembly.

5. The chassis of claim 1, wherein the exterior of the at least one side panel further comprises one or more fins for cooling.

6. The chassis of claim 5, wherein a first U-shaped end of the first portion of the OHP is proximate to an inside edge or a top of the at least one rail and a second U-shaped end of the second portion of the OHP is proximate to the exterior of the at least one side panel or the at least one or more fins for cooling.

7. The chassis of claim 1, wherein the first portion of the OHP comprises an evaporator section of the OHP and the second portion of the OHP comprises a condenser section of the OHP.

8. The chassis of claim 1, wherein at least a portion of the chassis is formed by three-dimensional (3D) printing or additive manufacturing.

9. The chassis of claim 1 wherein the OHP comprises a channel in the rail and the side panel, and the channel is formed by 3D printing or additive manufacturing.

10. The chassis of claim 1, wherein the chassis is substantially formed of aluminum, titanium, copper, or their alloys.

11. A method of forming a chassis for enclosing and cooling electronic equipment using three-dimensional (3D) printing or additive manufacturing, said method comprising:
    forming, by a 3D printer, a top, a bottom, and two side panels that define an interior space, wherein each side panel has an interior side and an exterior side, a length and a height;
    forming, by the 3D printer, at least one rail located on the interior side of at least one of the side panels, wherein the rail extends inwardly toward the interior space and horizontally along the length of the interior side of the side panel, wherein the rail is configured to contact only a portion of a circuit card assembly comprising electronic equipment; and
    forming, by the 3D printer, an oscillating heat pipe (OHP), wherein a first portion of the OHP extends inwardly through the rail toward the interior space and is fully enveloped by the at least one rail, and extends toward the exterior side of the at least one of the side panels and into the at least one of the side panels, and a second portion of the OHP orthogonal to the first portion extends into the height of and is fully enveloped by the at least one side panel on which the rail is located, wherein at least a portion of heat from operation of the electronic equipment passes through the circuit card assembly to the at least one rail, and from the at least one rail to the first portion of the OHP, from the first portion of the OHP to the second portion of the OHP, and from the second portion of the OHP to the that at least one side panel on which the rail is located where it is dissipated into an environment.

12. The method of claim 11, further comprising forming, by the 3D printer, a front panel, and a back panel for the chassis.

13. The method of claim 11, further comprising forming, by the 3D printer, one or more cooling fins on the exterior of the at least one side panel.

14. The method of claim 13, wherein a first U-shaped end of the first portion of the OHP is formed by the 3D printer proximate to an inside edge or a top of the at least one rail and a second U-shaped end of the second portion of the OHP is formed by the 3D printer proximate to the exterior of the at least one side panel or the at least one or more fins for cooling.

15. The method of claim 11, wherein the first portion of the OHP comprises an evaporator section of the OHP and the second portion of the OHP comprises a condenser section of the OHP.

16. The method of claim 11, wherein the chassis is substantially formed of aluminum, titanium, copper, or their alloys by the 3D printer.

17. A system for enclosing and cooling electronic equipment, said system comprising:
    one or more circuit card assemblies (CCAs), each CCA comprising electronic equipment and a frame; and
    a chassis for enclosing and cooling the one or more CCAs during their operation, said chassis comprising:
      a top panel, a bottom panel, a front panel, a back panel, and two side panels that define an interior space, each side panel having an interior, an exterior, a length and a height, wherein the exterior of at least one of the side panels further comprises one or more fins for cooling;
      a plurality of rails located on the interior of each of the two side panels, wherein each rail extends inwardly toward the interior space and horizontally along the length of the interior side of the side panel, wherein each rail is configured to contact only a portion of the frame of each of the one or more CCAs, wherein the two side panels are parallel to one another; and an oscillating heat pipe (OHP), wherein an evaporator section of the OHP extends inwardly through the rail toward the interior space and is fully enveloped by at least one of the plurality of rails, and extends toward the exterior side of the at least one of the side panels and into the at least one of the side panels, and a condenser section of the OHP orthogonal to the evaporator section extends into the height of and is fully enveloped by the side panel on which the rail is located, wherein a first U-shaped end of the evaporator portion of the OHP is proximate to an inside edge or a top of the at least one rail and a second U-shaped end of the condenser section is proximate to the exterior of the at least one side panel or the at least one or more fins for cooling, wherein at least a portion of heat from operation of the electronic equipment passes through the one or more CCAs to the frame of the CCA, from the frame of the CCA to the rail, and from the rail to the evaporator section of the OHP, from the evaporator section of the OHP to the condenser section of the OHP, and from the condenser section of the OHP to the that side panel on which the rail is located where it is dissipated into an environment.

18. The system of claim 17, further comprising a cold plate, wherein at least a portion of the OHP extends into the cold plate.

19. The system of claim 18, wherein the OHP is formed by 3D printing or additive manufacturing.

20. The system of claim 17, wherein at least a portion of the chassis is formed by three-dimensional (3D) printing or additive manufacturing.

21. The system of claim 17, wherein the chassis is substantially formed of aluminum, titanium, copper, or their alloys.

* * * * *